United States Patent
Song

(10) Patent No.: US 6,563,484 B1
(45) Date of Patent: May 13, 2003

(54) APPARATUS AND METHOD FOR PROCESSING SYNCHRONIZING SIGNAL OF MONITOR

(75) Inventor: Myoung Jun Song, Taegu-shi (KR)

(73) Assignee: LG Electronics Inc., Seoul (KR)

( * ) Notice: Subject to any disclaimer, the term of this patent is extended or adjusted under 35 U.S.C. 154(b) by 186 days.

(21) Appl. No.: 09/635,873

(22) Filed: Aug. 10, 2000

(30) Foreign Application Priority Data

Aug. 13, 1999 (KR) ............................................. 99-33437

(51) Int. Cl.[7] ................................................. G09G 3/36
(52) U.S. Cl. .......................... 345/98; 345/699; 345/213; 345/99; 348/521
(58) Field of Search .......................... 345/699, 98, 3.4, 345/213, 211, 99, 204, 132, 127, 698; 348/521, 516–542, 213

(56) References Cited

U.S. PATENT DOCUMENTS 5,053,862 A * 10/1991 Phillips et al.
6,181,330 B1 * 1/2001 Yui et al.
6,348,931 B1 * 2/2002 Suga et al.
6,392,642 B1 * 5/2002 Wu \* cited by examiner

*Primary Examiner*—Matthew C. Bella
*Assistant Examiner*—Hau Nguyen
(74) *Attorney, Agent, or Firm*—Fleshner & Kim, LLP

(57) ABSTRACT

An apparatus and method for processing a synchronizing signal of a monitor is disclosed, in which an abnormal synchronizing signal is detected to avoid poor picture quality and any error in proceeding to a DPM mode. The apparatus for processing a synchronizing signal of a monitor includes a synchronizing signal processor for separating a synchronizing signal from SOG signal, a detector for detecting a synchronizing signal width and a horizontal line width output from the synchronizing signal processor, a microcomputer for determining abnormality of the synchronizing signal using relative ratio of the detected synchronizing signal width and horizontal line width, and a clock generator for generating a clock in accordance with a control signal of the microcomputer and outputting the clock to the detector.

21 Claims, 4 Drawing Sheets

APPARATUS AND METHOD FOR PROCESSING SYNCHRONIZING SIGNAL OF MONITOR

BACKGROUND OF THE INVENTION

1. Field of the Invention

The present invention relates to a monitor, and more particularly, to an apparatus and method for processing a synchronizing signal of a monitor.

2. Background of the Related Art

Generally, a monitor is an apparatus for displaying an image signal of an image mode such as SVGA (800×600), XGA (1024×768) and SXGA (1280×1024). The image signal is transmitted from a main body connected to a monitor, for example, a video card of a work station or a personal computer, after a series of signal processing. Examples of flat panel display devices include monitors which employ a cathode ray tube, and a digital monitor which employs a liquid crystal display (LCD). Particularly, as a typical flat panel display device, the digital monitor suitable for high definition has been commercially used.

As shown in FIG. 1, a related art apparatus for processing a synchronizing signal of a monitor includes a synchronizing signal processor 1, a microcomputer 2, a phase locked loop (PLL) 3, and a scaler 4.

When various synchronizing signals adapted to standards of respective system makers, such as a sync on green (SOG) signal and a complex synchronizing signal C-sync, are input to the synchronizing signal processor 1, the synchronizing signal processor 1 separates these signals and outputs the complex synchronizing signal C-sync and a vertical synchronizing signal V-sync. On the other hand, when a horizontal synchronizing signal H-sync and the vertical synchronizing signal V-sync are input to the synchronizing signal processor 1, the synchronizing signal processor 1 passes these signals straight through.

The microcomputer 2 determines whether the monitor should be in an image mode or a display power management (DPM) mode, in accordance with the frequency of the synchronizing signals output from the synchronizing signal processor 1. The microprocessor 2 then outputs a control signal to perform a signal processing operation according to a corresponding image mode.

The PLL 3 generates a clock pulse according to the control signal of the microcomputer 2 and also generates a new horizontal synchronizing signal synchronized with the clock pulse. The scaler 4 processes R/G/B image signals for each unit of frame in accordance with the clock pulse and the horizontal synchronizing signal from the PLL 3.

If no vertical or horizontal synchronizing signals are detected, it is determined that the monitor is not used. This indicates that the monitor should be in DPM mode. In that case, the microcomputer 2 supplies power only to essential elements for standby state and cuts off the power for the other elements, such as a deflection IC and a heater which require high power.

In operation, the synchronizing signal processor 1 receives either the SOG signal and the complex synchronizing signal C-sync or the horizontal synchronizing signal Hsync and the vertical synchronizing signal V-sync from a main body. If the SOG signal is input to the synchronizing signal processor 1, as shown in FIG. 2a, the synchronizing signal processor 1 processes the SOG signal so that a signal below a synchronizing signal detecting level is output at high level, and a signal above the synchronizing signal detecting level is output at low. Thus, the synchronizing signal processor 1 finally outputs a complex synchronizing signal and a vertical synchronizing signal.

Furthermore, the synchronizing signal processor outputs the horizontal synchronizing signal and the vertical synchronizing signal, i.e., separate synchronizing signals, without additional processing. The synchronizing signal processor divides the complex synchronizing signal into the horizontal synchronizing signal and the vertical synchronizing signal and outputs them to the microcomputer 2.

Subsequently, the microcomputer 2 identifies the proper mode of the monitor, i.e., image mode or DPM mode, in accordance with the frequency of the synchronizing signals output from the synchronizing signal processor 1. The microcomputer 2 then outputs a control signal to the PLL 3 to supply a corresponding sampling clock to the scaler 4.

The PLL 3 generates a clock pulse set by the control signal of the microcomputer 2 with a horizontal synchronizing signal synchronized with the clock pulse, and supplies the clock pulse and the horizontal synchronizing signal to the scaler 4. The scaler 4 processes R/G/B image signals transmitted from the main body in accordance with the control signal of the microcomputer 2.

In normal operation, when the monitor is not used, no synchronizing signal is input to the synchronizing signal processor 1. Accordingly, the microcomputer 2 proceeds to the DPM mode.

However, since a G signal exists even if no synchronizing signal is input to the synchronizing signal processor, the G signal is input to the synchronizing signal processor through the SOG input terminal. As shown in FIG. 2b, when the synchronizing signal is abnormally separated from the G signal, the abnormal synchronizing signal is input to the microcomputer 2. Accordingly, although the monitor is not operating, the microcomputer 2 does not proceed to the DPM mode. As a result, an image processing error may occur. This could lead to poor picture quality and unnecessary power consumption.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide an apparatus and method for processing a synchronizing signal of a monitor that substantially obviates at least one or more of the problems caused by limitations and disadvantages of the related art.

Another object of the present invention is to provide an apparatus and method to detect an abnormal synchronizing signal.

Another object of this invention is to avoid poor picture quality and errors in proceeding to a DPM mode in a monitor.

Another object of this invention is to prevent unnecessary power consumption in a monitor.

To achieve these and other advantages and in accordance with the purpose of the present invention, as embodied and broadly described, an apparatus for processing a synchronizing signal of a monitor according to a preferred embodiment of the present invention includes a synchronizing signal processor for separating a synchronizing signal from SOG signal, a detector for detecting a synchronizing signal width and a horizontal line width output from the synchronizing signal processor, a microcomputer for determining abnormality of the synchronizing signal using relative ratio of the detected synchronizing signal width and horizontal line width, and a clock generator for generating a clock in accordance with a control signal of the microcomputer and outputting the clock to the detector.

In order to achieve the at least above objects in whole or in parts, there is further provided a method for processing a synchronizing signal of a monitor according to the present invention, including detecting a synchronizing signal width and a corresponding horizontal line width, comparing ratio of the synchronizing signal width to the horizontal line width with a set ratio, and determining abnormality of the synchronizing.

In order to achieve the at least above objects in whole or in parts, there is further provided an apparatus for processing a synchronizing signal of a monitor that includes a synchronizing signal processor to separate a synchronizing signal from an input signal, a detector to detect a synchronizing signal width and a horizontal line width based on the synchronizing signal, a microcomputer to determine whether the synchronizing signal is normal or abnormal, in accordance with a relative ratio of the synchronizing signal width and the horizontal line width, and a clock generator to generate a clock pulse in accordance with a control signal of the microcomputer and output the clock pulse to the detector.

In order to achieve the at least above objects in whole or in parts, there is further provided a method for processing a synchronizing signal of a monitor that includes (a) detecting a width of a synchronizing signal and a width of a corresponding horizontal line, (b) comparing a ratio of the synchronizing signal width to the horizontal line width with a prescribed value; and (c) determining whether the synchronizing signal is normal or abnormal, in accordance with the result of the comparison.

In order to achieve the at least above objects in whole or in parts, there is further provided an image display device having a signal processor, a microcomputer, a clock generator and a scaler, the improvement includes a first counting circuit, coupled to receive a first clock signal and one of a horizontal synchronizing signal and a complex synchronizing signal, a reset generator, coupled to receive the first clock signal and one of the horizontal synchronizing signal and a complex synchronizing signal, and output a reset signal, a second counting circuit coupled to receive the first clock signal and the reset signal, wherein the first counting circuit counts a width of the synchronizing signal, and the second counting circuit counts a horizontal line width.

In order to achieve the at least above objects in whole or in parts, there is further provided a method for detecting an abnormal synchronizing signal that includes detecting a width of a synchronizing signal, detecting a width of a corresponding horizontal line, determining whether the width of the synchronizing signal is smaller than half of the width of the horizontal line, if the width of the synchronization signal is smaller than half of the width of the horizontal line, then determining if a ratio of the synchronizing signal width to the horizontal line width is greater than a prescribed value, and if it is determined that the synchronizing signal width is not smaller than half of the horizontal line width, then setting a revised synchronizing signal width equivalent to the synchronizing signal width minus the horizontal line width, and determining if a ratio of the revised synchronizing signal width to the horizontal line width is greater than or equal to the prescribed value.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
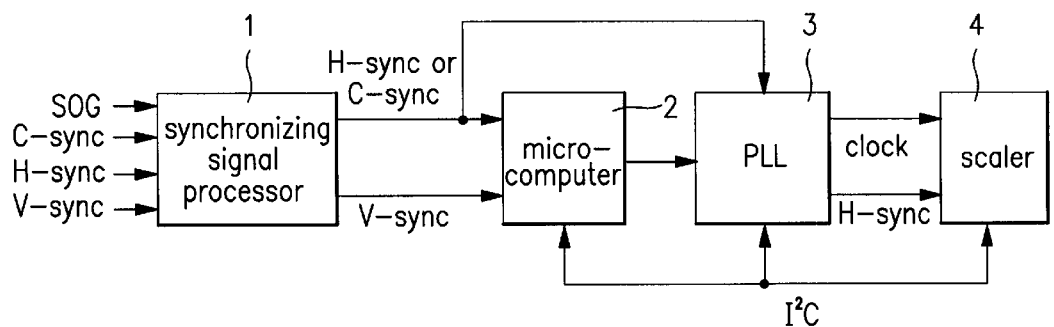
FIG. 1 is a block diagram showing a related art apparatus for processing a synchronizing signal of a monitor.
Figure 2A:
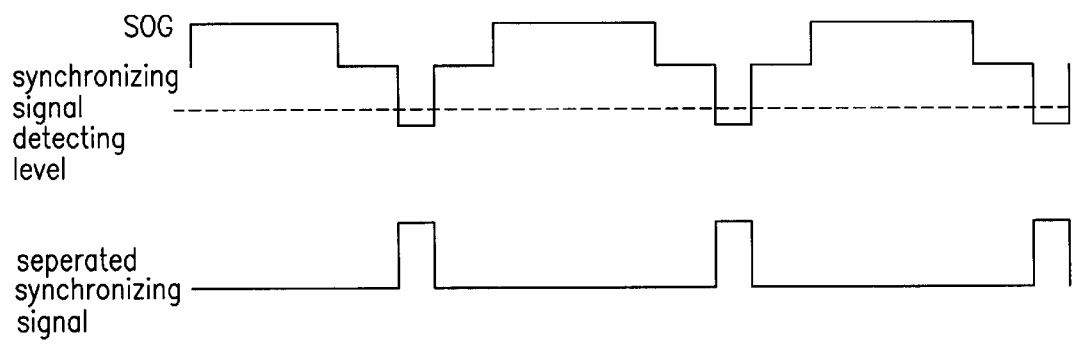
FIGS. 2a and 2b are waveform diagrams showing the operation of separating a synchronizing signal according to FIG. 1.
Figure 2B:
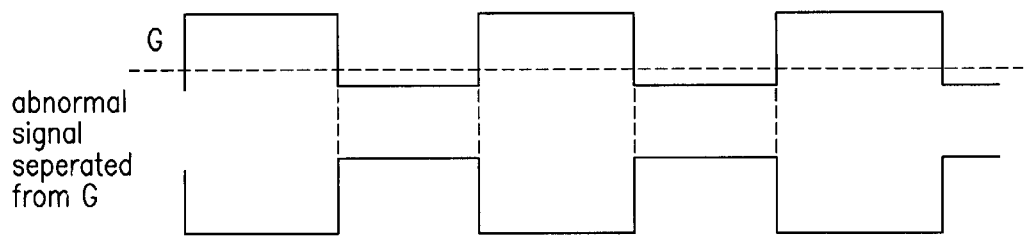
Figure 3:
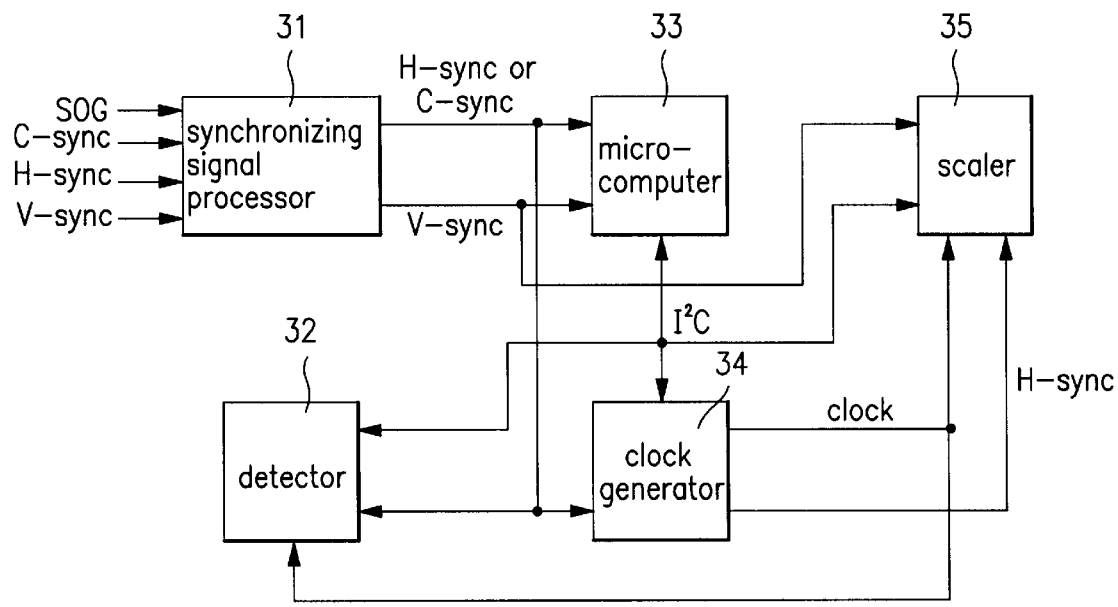
FIG. 3 is a block diagram showing an apparatus for processing a synchronizing signal of a monitor according to a preferred embodiment.

As shown in FIG. 3, an apparatus for processing a synchronizing signal of a monitor according to a preferred embodiment of the present invention includes a synchronizing signal processor 31, a detector 32, a microcomputer 33, a clock generator 34, and a scaler 4.

When various synchronizing signals, such as a sync on green (SOG) signal and a complex synchronizing signal C-sync, are input to the synchronizing signal processor 31, the synchronizing signal processor 31 separates these signals and outputs the complex synchronizing signal C-sync and a vertical synchronizing signal V-sync. When a horizontal synchronizing signal H-sync and the vertical synchronizing signal V-sync are input to the synchronizing signal processor 31, the synchronizing signal processor 31 outputs these signals without processing. The detector 32 detects a synchronizing signal width and a horizontal line width output of the signals output from the synchronizing signal processor 31. This information is then outputted from the detector 32.

The microcomputer 33 determines whether the synchronizing signal is abnormal using the relative ratio of the synchronizing signal width and the horizontal line width detected from the detector 32. The microcomputer 33 then determines whether to perform an image mode or a DPM mode, according to the frequency of the synchronizing signals output from the synchronizing signal processor 31, and outputs a control signal to perform a signal processing operation according to a corresponding image mode.

The clock generator 34 generates a clock pulse according to the control signal of the microcomputer 33 and also generates a new horizontal synchronizing signal synchronized with the clock. The scaler 35 processes R/G/B image signals for each frame unit in accordance with the clock pulse and the horizontal synchronizing signal from the clock generator 34.

Figure 4:
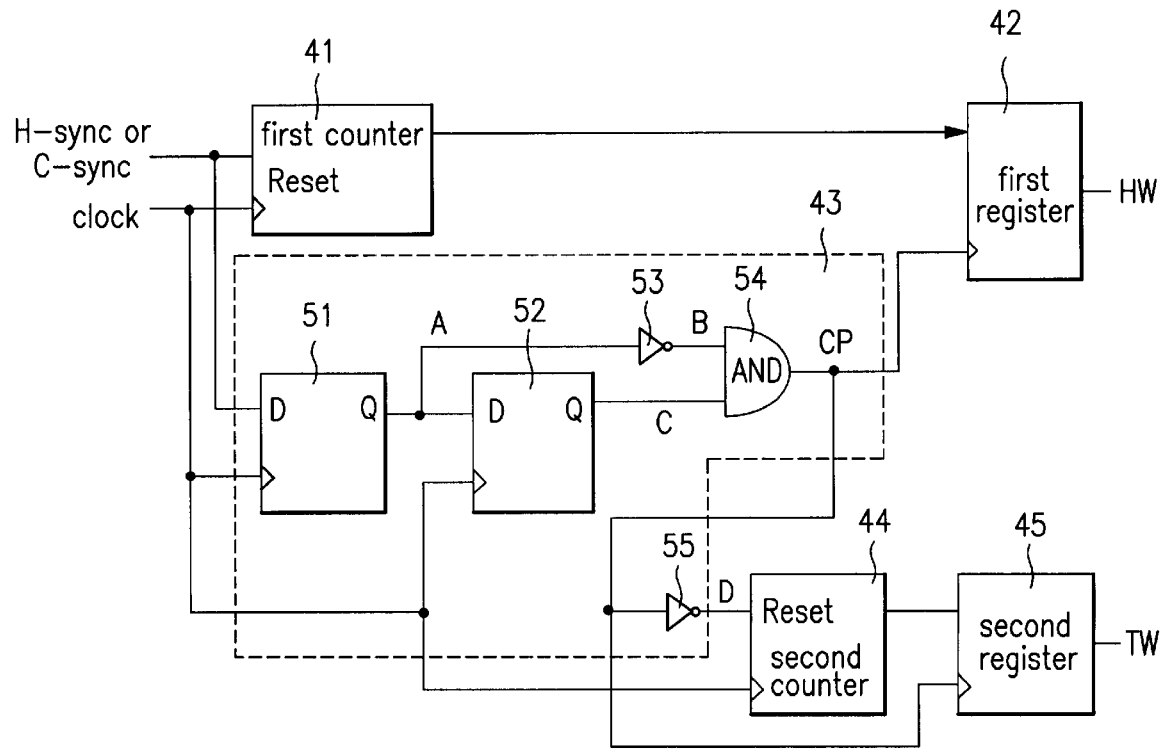
FIG. 4 is a detailed block diagram showing a detector of FIG. 3.

As shown in FIG. 4, the detector 32 includes a first counter 41, a reset signal generator 43, a second counter 44, a first register 42, and a second register 45. The first counter 41 counts the synchronizing signal width in accordance with the clock pulse output from the clock generator 34 using the horizontal synchronizing signal or the complex synchronizing signal output from the synchronizing signal processor 31 as a reset signal. The reset signal generator 43 generates a reset signal for detecting the horizontal line width using the horizontal synchronizing signal or the complex synchronizing signal output from the synchronizing signal processor 31 and the clock pulse output from the clock generator 34.

The second counter 44 counts the horizontal line width in accordance with the reset signal generated by the reset signal generator 43. The first register 42 outputs a counted value of the first counter 41 using the reset signal for detecting the horizontal line width as a clock. The second register 45 outputs a counted value of the second counter 44, which is synchronized with the output of the first register 42.

The reset signal generator 43 includes a first D flip-flop 51 for synchronizing the horizontal synchronizing signal or the complex synchronizing signal with the clock output from the clock generator 34, and a first inverter 53 for inverting the output of the first D flip-flop 51. It further includes a second D flip-flop 52 for delaying the output of the first D flip-flop 51 by one clock, a logic gate 54, for example an AND gate, for performing an AND operation of the output of the second D flip-flop 52, and a second inverter 55 for inverting the output of the logic gate 54 and generating the reset signal for detecting the horizontal line width. The PLL acts as the clock generator 34.

A method for processing a synchronizing signal of a monitor according to a preferred embodiment of the present invention will now be described with reference to FIGS. 5 and 6.

The synchronizing signal processor 31 receives either the SOG signal and the complex synchronizing signal C-sync, or the horizontal synchronizing signal H-sync and the vertical synchronizing signal V-sync from a main body. If the SOG signal is input to the synchronizing signal processor 31, the synchronizing signal processor 31 outputs the SOG signal as the complex synchronizing signal and the vertical synchronizing signal.

If the horizontal synchronizing signal and the vertical synchronizing signal, i.e., separate synchronizing signals are input to the synchronizing signal processor 31, the synchronizing signal processor 31 outputs the signals as they are, preferably without any further processing. The synchronizing signal processor 31 divides the complex synchronizing signal into the horizontal synchronizing signal and the vertical synchronizing signal and outputs them to the microcomputer 33.

Figure 5:
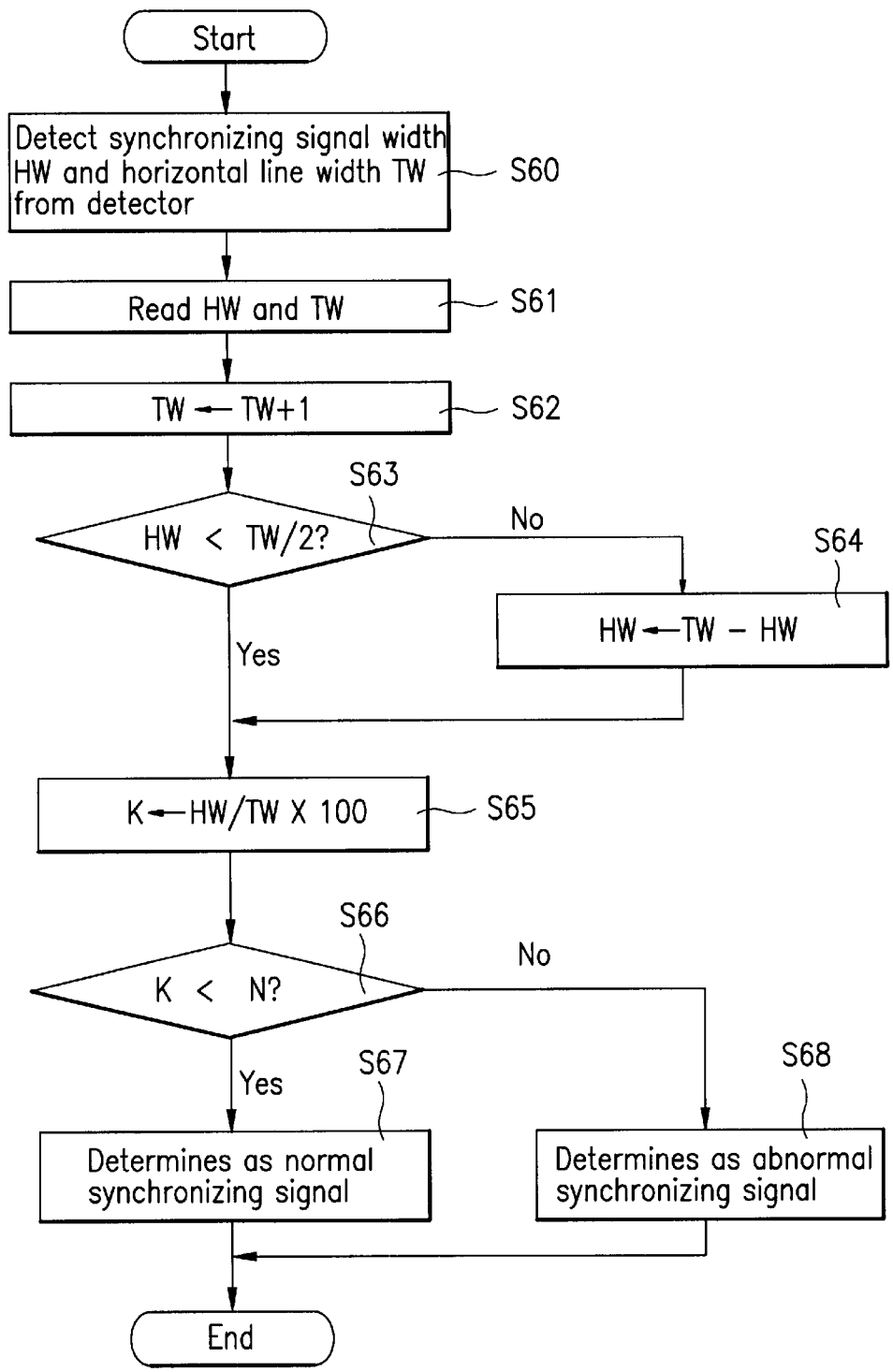
FIG. 5 is a flow chart showing a method for processing a synchronizing signal according to a preferred embodiment of the present invention.
Figure 6:
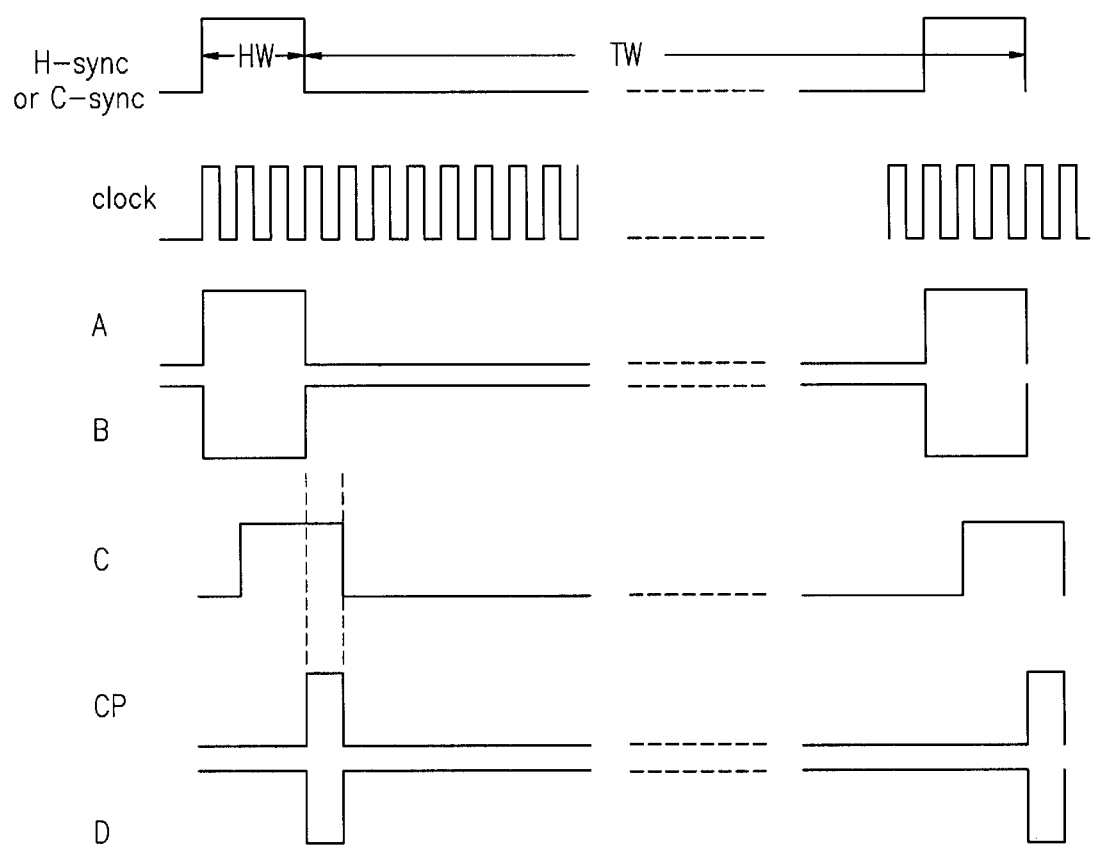
FIG. 6 is a waveform diagram showing waveforms associated with detecting a synchronizing signal width and a horizontal line width.

Next, referring to FIG. 5, the detector 32 detects a width HW of the horizontal synchronizing signal H-sync or the complex synchronizing signal C-sync, and a width TW of the horizontal line as shown in step S60.

The operation of detecting the synchronizing signal width and the horizontal line width from the detector 32 will be described with reference to FIG. 6.

The first counter 41 counts the synchronizing signal width HW in accordance with the clock pulse generated by the clock generator 34, using the horizontal synchronizing signal H-sync and the complex synchronizing signal C-sync as reset signals.

The reset signal generator 43 synchronizes the synchronizing signal with the clock pulse through the first D flip-flop 51 to output signal 'A', and inverts signal 'A' through the first inverter 53 to output signal 'B'. Subsequently, the reset signal generator 43 delays the output of the first D flip-flop 51 by one period of the clock pulse through the second D flip-flop 52 to output signal 'C'. Then, the reset signal generator 43 performs AND operation of signals 'B' and 'C' through the AND gate 54 to output signal 'CP'. Finally, the reset signal generator 43 inverts 'CP' through the second inverter 55 to output a reset signal 'D' for detecting the horizontal line width.

The second counter 44 counts the horizontal line width TW in accordance with the clock pulse generated by the clock generator 34, using the reset signal for detecting the horizontal line width.

The first and second registers 42 and 45 synchronize the counted value 'HW' of the first counter 41 with the counted value 'TW' of the second counter 44 using 'CP' as a clock, and output the synchronized value to the microcomputer 33.

Next, referring again to FIG. 5, the microcomputer 33 reads HW and TW as shown in step S61, and adds 1 to TW as shown in step S62. Since the counted value TW is obtained by counting the horizontal line width from the time when one clock pulse passes in accordance with the clock pulse, the actual horizontal line width is obtained by adding one clock, i.e., 1 to the counted value TW.

It is then determined whether HW is smaller than TW/2 as shown in step S63. If HW is smaller than TW/2, a ratio K of HW to TW is calculated as shown in step S65. If, however, HW is not smaller than TW/2, a value obtained by subtracting HW from TW becomes a new value of HW, as shown in step S64, and a ratio K of HW to TW is calculated as shown in step S65.

Here, HW is a counted value for a high period of the synchronizing signal. This means that HW is a counted value for the synchronizing signal width if the synchronizing signal is positive while HW is a counted value for a period other than the synchronizing signal width if the synchronizing signal is negative. That is, if HW is greater than TW/2, HW is a counted value for a period other than the synchronizing signal width. Accordingly, a value obtained by subtracting TW from HW becomes a counted value for the actual synchronizing signal width.

Then, as shown in step S66, it is determined whether K is smaller than a prescribed ratio (N). If K is smaller than N, it is determined that the synchronizing signal is normal as shown in step S67. N is preferably a ratio of the synchronizing signal width to the horizontal line width according to a VESA standard. In case of the SOG signal, N is 20%.

Meanwhile, as a result of the determination of step S66, if K is greater than N, the synchronizing signal is abnormal as recited in step S68.

The microcomputer 33 subsequently applies the control signal to the respective elements to perform a normal image signal processing operation if it is determined that the synchronizing signal is normal. If it is determined that the synchronizing signal is abnormal, however, the microcomputer 33 controls the respective elements so as not to cause screen processing error or proceeds to the DPM mode.

The apparatus for processing a synchronizing signal of a monitor according to the present invention has several advantages. For example, the respective elements are properly controlled or the DPM mode proceeds, even if the synchronizing signal is abnormal, thereby avoiding screen processing error. Thus, poor picture quality and unnecessary power consumption can be prevented, and product reliability can be improved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus for processing a synchronizing signal of a monitor, comprising:
    a synchronizing signal processor to separate a synchronizing signal from an input signal;
    a detector to detect a synchronizing signal width and a horizontal line width based on the synchronizing signal, the synchronizing signal width being one of a horizontal synchronizing signal width and a complex synchronizing signal width;
    a microcomputer to determine whether the synchronizing signal is normal or abnormal, in accordance with a relative ratio of the synchronizing signal width and the horizontal line width; and
    a clock generator to generate a clock pulse in accordance with a control signal of the microcomputer and output the clock pulse to the detector.

2. The apparatus of claim 1, wherein the detector comprises:
    a first counter to count the synchronizing signal width in accordance with the clock pulse output from the clock generator, using one of a horizontal synchronizing signal and a complex synchronizing signal output from the synchronizing signal processor;
    a reset signal generator to generate a reset signal to detect the horizontal line width, using the horizontal synchronizing signal or the complex synchronizing signal output from the synchronizing signal processor and the clock pulse output from the clock generator; and
    a second counter to count the horizontal line width in accordance with the reset signal generated by the reset signal generator.

3. The apparatus of claim 2, wherein the reset signal generator comprises:
    a first latch to synchronize one of the horizontal synchronizing signal and the complex synchronizing signal with the clock output from the clock generator;
    a second latch to delay the output of the first latch by one clock pulse; and
    a logic gate to perform a logic operation to the output of the second latch.

4. The apparatus of claim 3, wherein each of the first latch and the second latch comprises a D flip-flop.

5. The apparatus of claim 3, wherein the logic gate is an AND gate.

6. The apparatus of claim 3, wherein the detector further comprises:
    a first register to output a counted value of the first counter using an output of the logic gate as a clock; and
    a second register to output a counted value of the second counter, which is synchronized with the output of the first register.

7. The apparatus of claim 1, wherein the clock generator is a Phase Locked Loop.

8. The apparatus of claim 1, wherein the input signal is a signal-on-green (SOG) signal.

9. A method for processing a synchronizing signal of a monitor, comprising:
    (a) detecting a width of a synchronizing signal and a width of a corresponding horizontal line signal, the synchronizing signal being one of a horizontal synchronizing signal and a complex synchronizing signal;
    (b) comparing a ratio of the synchronizing signal width to the horizontal line width with a prescribed value; and
    (c) determining whether the synchronizing signal is normal or abnormal, in accordance with the result of the comparison.

10. The method of claim 9, wherein the step (c) includes determining that the synchronizing signal is abnormal if the ratio of the synchronizing signal width to the horizontal line width is greater than the prescribed value.

11. The method of claim 9, wherein the prescribed value is a ratio of the synchronizing signal width to the horizontal line width according to a VESA standard.

12. The method of claim 9, wherein the synchronizing signal width is set to the synchronizing signal width minus the horizontal line width if the synchronizing signal width is greater than the horizontal line width divided by 2.

13. The method of claim 9, wherein the synchronizing signal is a horizontal synchronizing signal.

14. An improved image display device having a signal processor, a microcomputer, a clock generator, and a scaler, the improvement comprising:
    a first counting circuit, coupled to receive a first clock signal and a synchronization signal, the synchronization signal being one of a horizontal synchronizing signal and a complex synchronizing signal;
    a reset generator, coupled to receive the first clock signal and the synchronization signal, and output a reset signal;
    a second counting circuit coupled to receive the first clock signal and the reset signal, wherein the first counting circuit counts a width of the synchronizing signal, and the second counting circuit counts a horizontal line width.

15. The apparatus claim 14, wherein the first counting circuit comprises a first counter coupled to a first register, the second counting circuit comprises a second counter coupled to a second register, the first register receives an output of the first counter and a second clock signal output from the reset generator, and the second register receives an output of the second counter and a second clock signal.

16. The apparatus of claim 15, further comprising:
    a synchronizing signal processor, coupled to receive a plurality of synchronization signals and output a vertical synchronization signal and one of the horizontal synchronization signal and the complex synchronization signal;
    a microcomputer coupled to receive the output of the synchronizing signal processor and the first and second registers;
    a clock generator to generate the first clock signal; and
    a scaler; coupled to receive an R/G/B image signal, the first clock signal, and the horizontal synchronizing signal.

17. The apparatus of claim 14, wherein the reset signal generator comprises:

a first latch, coupled to receive the first clock signal and one of the horizontal synchronizing signal and complex synchronizing signal;

a second latch, coupled to receive the output of the first latch;

a logic gate, coupled to receive and logically combine the output of the first latch as a first input and the second latch as a second input to generate the second clock signal.

18. The apparatus of claim 17, further comprising a first inverter, coupled to receive the output of the first latch and provide the first input to the logic gate, and a second inverter coupled to receive the second clock signal to generate the reset signal.

19. A method for detecting an abnormal synchronizing signal, comprising:

detecting a width of a synchronizing signal, the synchronizing signal being one of a horizontal synchronizing signal and a complex synchronizing signal;

detecting a width of a corresponding horizontal line;

determining whether the width of the synchronizing signal is smaller than half of the width of the horizontal line;

if the width of the synchronization signal is smaller than half of the width of the horizontal line, then determining if a ratio of the synchronizing signal width to the horizontal line width is greater than a prescribed value; and if it is determined that the synchronizing signal width is not smaller than half of the horizontal line width, then setting a revised synchronizing signal width equivalent to the synchronizing signal width minus the horizontal line width, and determining if a ratio of the revised synchronizing signal width to the horizontal line width is greater than or equal to the prescribed value.

20. The method of claim 19, wherein the prescribed value is a VESA standard.

21. The method of claim 19, further comprising determining that the synchronization signal is abnormal if the ratio is greater than the prescribed value.

* * * * *